(12) United States Patent
Mochizuki et al.

(10) Patent No.: US 9,140,726 B2
(45) Date of Patent: Sep. 22, 2015

(54) SUPPORT BODY FOR CONTACT TERMINALS AND PROBE CARD

(71) Applicant: TOKYO ELECTRON LIMITED, Tokyo (JP)

(72) Inventors: Jun Mochizuki, Yamanashi (JP); Kunihiro Furuya, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 256 days.

(21) Appl. No.: 13/652,895

(22) Filed: Oct. 16, 2012

(65) Prior Publication Data

US 2013/0093446 A1    Apr. 18, 2013

(30) Foreign Application Priority Data

Oct. 17, 2011   (JP) ................................ 2011-228243

(51) Int. Cl.
| | |
|---|---|
| *G01R 31/26* | (2014.01) |
| *G01R 1/073* | (2006.01) |
| *G01R 1/04* | (2006.01) |
| *G01R 31/27* | (2006.01) |

(52) U.S. Cl.
CPC .......... *G01R 1/07371* (2013.01); *G01R 1/0491* (2013.01); *G01R 31/27* (2013.01)

(58) Field of Classification Search
None
See application file for complete search history.

(56) References Cited

U.S. PATENT DOCUMENTS

| | | | | |
|---|---|---|---|---|
| 6,891,385 | B2 * | 5/2005 | Miller | 324/750.08 |
| 2003/0122567 | A1 * | 7/2003 | Miller | 324/765 |
| 2007/0205788 | A1 * | 9/2007 | Natsuhara et al. | 324/760 |
| 2011/0006799 | A1 * | 1/2011 | Mochizuki et al. | 324/756.07 |

FOREIGN PATENT DOCUMENTS

| | | |
|---|---|---|
| CN | 101910847 A | 12/2010 |
| JP | 10-96747 | 4/1998 |
| JP | 2008-134248 | 6/2008 |
| KR | 10-2011-0019698 | 2/2011 |
| WO | WO 2009/104589 A1 | 8/2009 |

OTHER PUBLICATIONS

Office Action issued Apr. 7, 2015 in Japanese Patent Application No. 2011-228243.

* cited by examiner

*Primary Examiner* — Jermele M Hollington
(74) *Attorney, Agent, or Firm* — Oblon, McClelland, Maier & Neustadt, L.L.P.

(57) ABSTRACT

A support body for a plurality of contact terminals included in a probe card for inspecting semiconductor devices formed in a semiconductor substrate is provided. The support body includes a main body formed by stacking a plurality of plate-shaped members, a plurality of contact terminal holes formed through the main body in a thickness direction of the plate-shaped members, and one or more coolant paths provided in the main body. Further, the contact terminals respectively are inserted into the contact terminal holes.

3 Claims, 6 Drawing Sheets

SUPPORT BODY FOR CONTACT TERMINALS AND PROBE CARD

CROSS-REFERENCE TO RELATED APPLICATIONS

This application claims priority to Japanese Patent Application No. 2011-228243 filed on Oct. 17, 2011, the entire contents of which are incorporated herein by reference.

FIELD OF THE INVENTION

The present invention relates to a support body for contact terminals and a probe card.

BACKGROUND OF THE INVENTION

In order to inspect each semiconductor device formed on a wafer, a prober is used as an inspection apparatus. The prober includes a stage on which a wafer is mounted, and a probe card which can be disposed to face the stage. The probe card includes a plate-shaped base, and probes which are columnar contact terminals disposed on a surface of the base facing the stage to correspond to electrode pads of the semiconductor devices of the wafer.

In the prober, when the probe card is positioned to correspond to the wafer mounted on the stage, the probes of the probe card are brought into contact with the electrode pads of the semiconductor devices, and electricity is allowed to flow from the probes through electrical circuits in the semiconductor devices connected to the electrode pads, thereby inspecting a conduction state of the electrical circuits.

Recently, in view of improving the inspection efficiency, a probe card for inspecting a plurality of semiconductor devices formed on a single wafer at the same time has been developed. In this probe card, the probes of thousands, in some cases, tens of thousands are provided corresponding to the electrode pads of the semiconductor devices. The probe card has a rectangular parallelepiped-shaped housing having a plurality of probe holes, and the housing supports the probes inserted into the probe holes. Conventionally, it is known that the housing is formed by stacking thin metal plates and diffusion bonding the thin metal plates (see, e.g., International Patent Application Publication No. WO2009/104589 (corresponding to U.S. Patent Application Publication No. 2011/0006799A1)).

However, recently, a magnitude of the current flowing through the probe for inspection increases, whereas a diameter of each of the probes decreases along with miniaturization of the electrical circuit of the semiconductor device. For example, a large amount of current ranging from 1 A to 2 A may flow in round rod-shaped probes each having a diameter of several tens μm. In the probes, conductance for the current is reduced due to the decrease in diameter of each probe, so that the resistance of each of the probes increases. Accordingly, when a large amount of current flows through the probes, there is a concern that the probes generate a large amount of heat, and the temperature of the probes becomes very high, thereby resulting in degradation of the probes.

SUMMARY OF THE INVENTION

In view of the above, the present invention provides a support body for contact terminals and a probe card capable of preventing degradation of the contact terminals.

In accordance with an embodiment of the present invention, there is provided a support body for a plurality of contact terminals included in a probe card for inspecting semiconductor devices formed in a semiconductor substrate, the support body including: a main body formed by stacking a plurality of plate-shaped members; a plurality of contact terminal holes formed through the main body in a thickness direction of the plate-shaped members; and one or more coolant paths provided in the main body. The contact terminals respectively are inserted into the contact terminal holes.

In accordance with another embodiment of the present invention, there is provided a support body for a plurality of contact terminals included in a probe card for inspecting semiconductor devices formed in a semiconductor substrate, the support body including: a pair of plate-shaped members facing each other; a thermal conductor filled between the pair of plate-shaped members; and a plurality of contact terminal holes formed by arranging openings, which are provided in each of the pair of plate-shaped members and formed through the plate-shaped members in a thickness direction of the plate-shaped members, to correspondingly align with one another in the thickness direction. The contact terminals are inserted into the contact terminal holes to be in contact with the thermal conductor.

In accordance with still another embodiment of the present invention, there is provided a probe card for inspecting semiconductor devices formed in a semiconductor substrate, the probe card including: a support body for a plurality of contact terminals. The support body includes a main body formed by stacking a plurality of plate-shaped members; a plurality of contact terminal holes formed through the main body in a thickness direction of the plate-shaped members; and one or more coolant paths provided in the main body, and the contact terminals respectively are inserted into the contact terminal holes.

In accordance with still another embodiment of the present invention, there is provided a probe card for inspecting semiconductor devices formed in a semiconductor substrate, the probe card including: a support body for a plurality of contact terminals. The support body includes a pair of plate-shaped members facing each other; a thermal conductor filled between the pair of plate-shaped members; and a plurality of contact terminal holes formed by arranging openings, which are provided in each of the pair of plate-shaped members and formed through the plate-shaped members in a thickness direction of the plate-shaped members, to correspondingly align with one another in the thickness direction, and the contact terminals are inserted into the contact terminal holes to be in contact with the thermal conductor.

BRIEF DESCRIPTION OF THE DRAWINGS

The objects and features of the present invention will become apparent from the following description of embodiments, given in conjunction with the accompanying drawings, in which:

FIGS. 5A and 5B are enlarged partial cross-sectional views showing configurations of modifications of the housing shown in FIG. 2, wherein FIG. 5A shows a second modification and FIG. 5B shows a third modification;

DETAILED DESCRIPTION OF THE EMBODIMENTS

Hereinafter, embodiments of the present invention will be described in detail with reference to the accompanying drawings which form a part hereof.

First, a probe card in accordance with a first embodiment of the present invention will now be described.

Figure 1A:
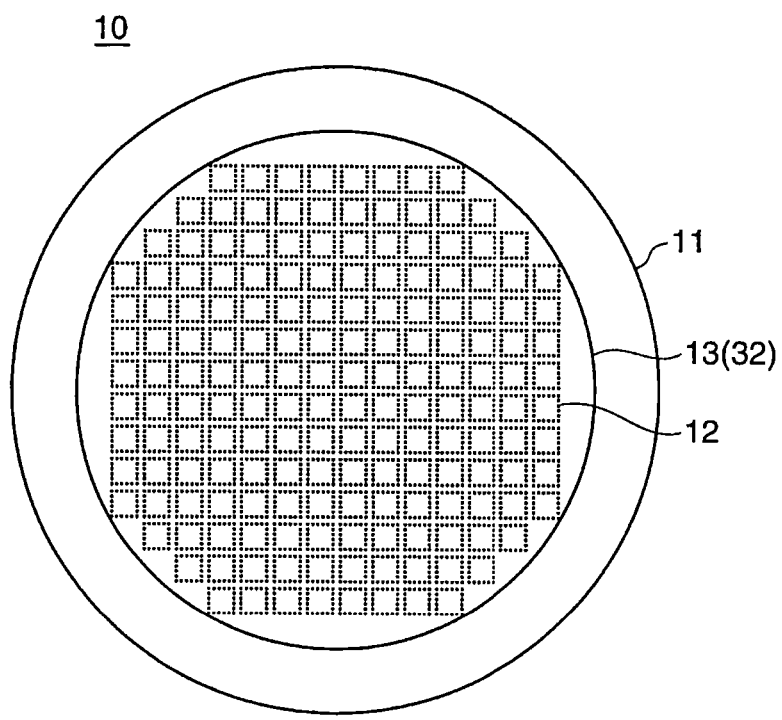
FIGS. 1A and 1B are schematic views showing a configuration of a probe card in accordance with a first embodiment of the present invention.
Figure 1B:
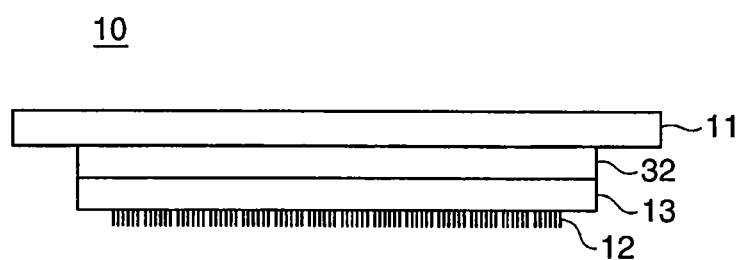

FIGS. 1A and 1B are schematic views showing a configuration of the probe card in accordance with the first embodiment of the present invention. FIG. 1A is a bottom view, and FIG. 1B is a side view.

In FIGS. 1A and 1B, a probe card 10 includes a disk-shaped base 11, and round rod-shaped probes (contact terminals) 12 disposed on a surface of the base 11 (the lower surface in FIG. 1B) facing a semiconductor wafer (not shown). The probes 12 are disposed at positions respectively corresponding to electrode pads of semiconductor devices in the semiconductor wafer.

In the probe card 10, each of the probes 12 is not directly attached to the base 11, and is attached to a housing 13 which is a cylindrical-shaped probe support body. The housing 13 is attached to the base 11 through a space transformer (ST) substrate 32.

Figure 2:
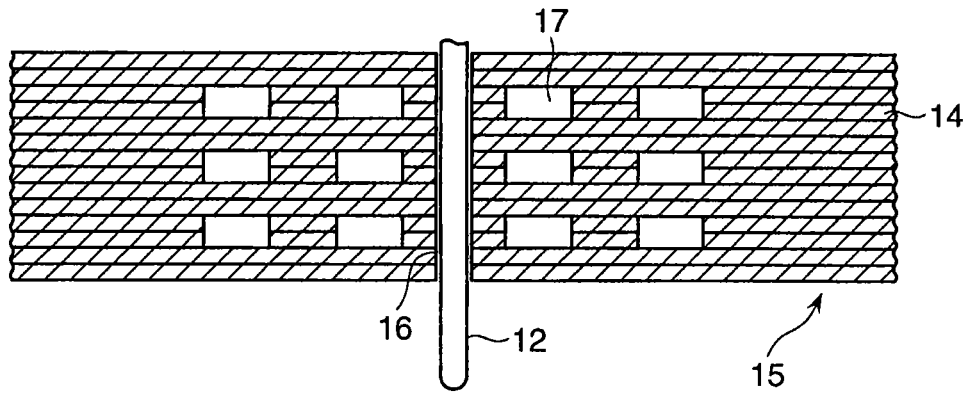
FIG. 2 is an enlarged partial cross-sectional view showing a configuration of a housing shown in FIGS. 1A and 1B.

FIG. 2 is an enlarged partial cross-sectional view showing a configuration of the housing shown in FIGS. 1A and 1B. In FIG. 2, a thickness direction of the housing 13 extends along a vertical direction in the figure, and the same is true for FIGS. 3A to 8.

In FIG. 2, the housing 13 includes a main body 15 formed by having stacking plate-shaped members, e.g., thin metal plates 14, cylindrical probe holes (contact terminal holes) 16 formed through the main body 15 in its thickness direction, and coolant paths 17 provided in the main body 15. One probe 12 is inserted into each of the probe holes 16. In FIG. 2, for explanation, one probe hole 16 and a structure therearound are merely illustrated.

In the housing 13, the thin metal plates 14 are bonded by diffusion bonding, and a diameter of the probe holes 16 is set to be larger than a diameter of the probes 12. For example, a difference between the diameter of the probe holes 16 and the diameter of the probes 12 is set to be in a range from 1 μm to 800 μm. That is, side surfaces of the probe holes 16 and the probes 12 are not in contact with each other in principle. The housing 13 is cooled by allowing a gas or liquid coolant, e.g., cold air or Galden (registered trademark) to flow in the coolant paths 17. The coolant paths 17 are disposed in the vicinity of the probe holes 16.

The diameter of the probes 12 is several tens μm, and each of the probes 12 has a high resistance value. Thus, Joule heat is generated in the probes 12 when a large amount of current flows through the probes 12 during the inspection of semiconductor devices. However, since the housing 13 is cooled, the Joule heat of the probes 12 inserted into the probe holes 16 is radiated to the side surfaces of the probe holes 16 or is transferred to the side surfaces of the probe holes 16 through the gas such as air existing between the side surfaces of the probes 12 and the probe holes 16, and then absorbed to the housing 13 that is cooled by the coolant flowing through the coolant paths 17. That is, the housing 13 makes the probes 12 cool down.

Figure 3A:
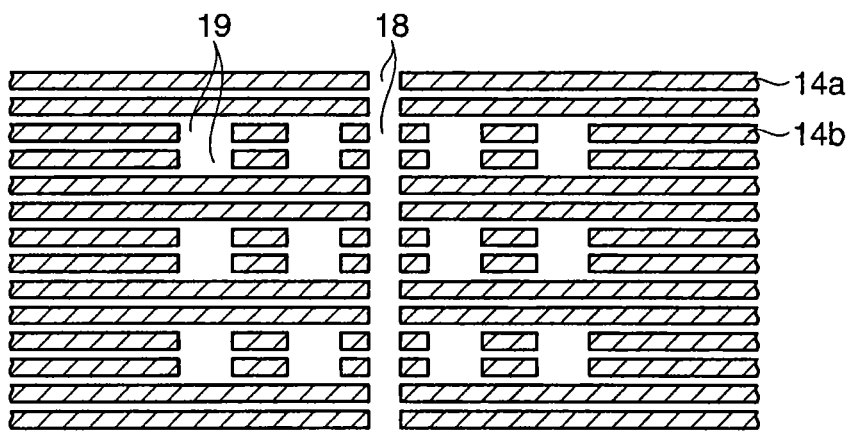
FIGS. 3A and 3B are process sequences illustrating a manufacturing method of the housing shown in FIG. 2.
Figure 3B:
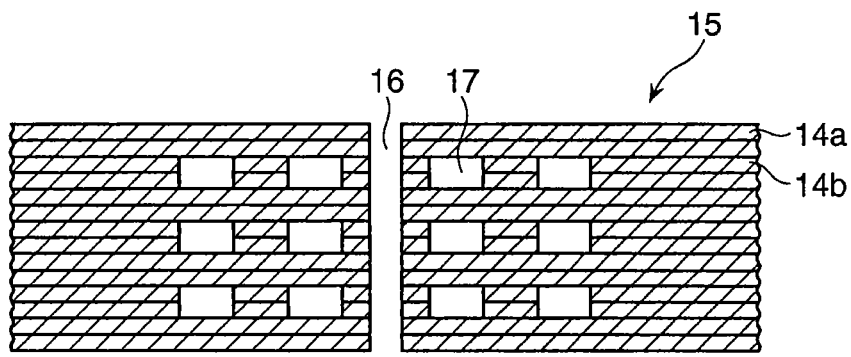

FIGS. 3A and 3B are processing sequences illustrating a method of manufacturing the housing shown in FIG. 2.

First, a plurality of openings 18 are formed in each of the thin metal plates 14 to extend through the thin metal plates 14 in the thickness direction by machining or etching, thereby forming a plurality of first thin plates 14a. Further, a plurality of the openings 18 are formed in each of the other thin metal plates 14 to extend through them in the thickness direction. Further, each of the other thin metal plates 14 is provided with cut-out portions 19 formed by cutting out parts of each of the other thin metal plates 14, thereby forming a plurality of second thin plates 14b.

Then, the first thin plates 14a and the second thin plates 14b are overlapped with one another in a predetermined order. Specifically, the first thin plates 14a and the second thin plates 14b are overlapped with one another such that the openings 18 in two adjacent thin plates (the first thin plates 14a and/or the second thin plates 14b) are arranged to correspondingly align with each other in the thickness direction, thereby forming each probe hole 16. Further, the second thin plates 14b are overlapped with one another such that the cut-out portions 19 in two adjacent second thin plates 14b are arranged to correspondingly align with each other in the thickness direction, thereby forming each coolant path 17 (see FIG. 3A).

Then, the overlapped first thin plates 14a and second thin plates 14b are bonded to one another by diffusion bonding to form the main body 15 (see FIG. 3B), and this process is finished.

In the housing 13 serving as the support body in accordance with this embodiment, the heat of the probes 12 inserted into the probe holes 16 formed through the main body 15 is transferred to the main body 15 which is cooled by the coolant flowing through the coolant paths 17. Therefore, it becomes possible to prevent the temperature of the probes 12 from being increased too high, thereby preventing degradation of the probes 12.

Further, in the housing 13, the coolant paths 17 are formed by overlapping the second thin plates 14b each of which is provided with the cut-out portions 19 formed by cutting out parts of each of the second thin plates 14b. Therefore, it becomes possible to easily form the coolant paths 17. Further, the probe holes 16 are formed by arranging the openings 18, formed through the first thin plates 14a and the second thin plates 14b in the thickness direction, to correspondingly align with one another in the thickness direction. Therefore, it becomes possible to easily form the probe holes 16.

Figure 4:
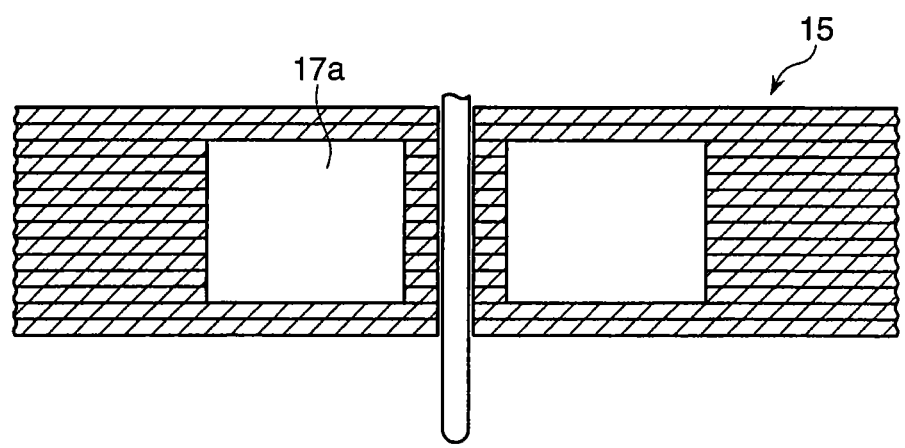
FIG. 4 is an enlarged partial cross-sectional view showing a configuration of a first modification of the housing shown in FIG. 2.

In the housing 13 described above, although the thin metal plates 14 have been stacked in the main body 15, the plate-shaped members may be formed of ceramic as well as metal. Further, the coolant paths 17 are not limited to have a relatively small size as shown in FIG. 2, and may have a large size as shown in FIG. 4. For example, coolant paths 17a may be formed to have a height extending over almost the thickness of the main body 15.

Figure 5A:
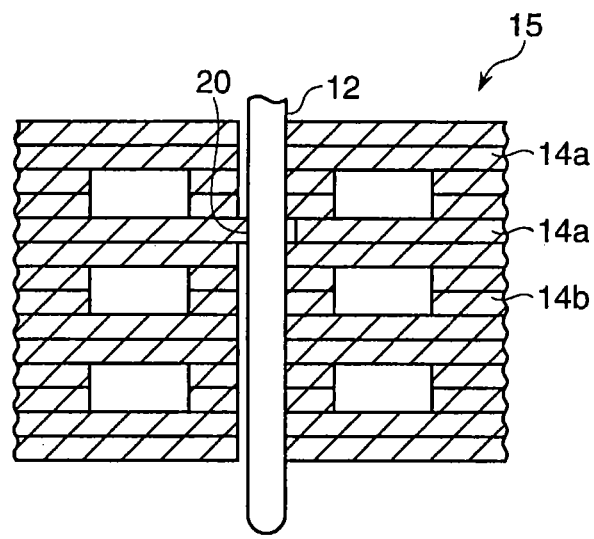
Figure 5B:
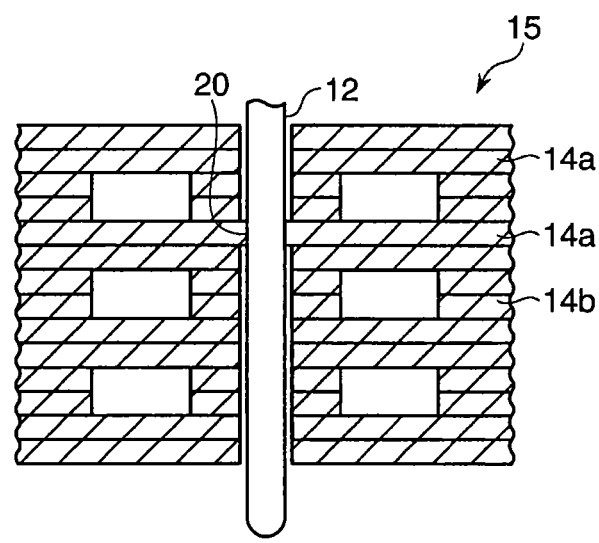

Further, in the housing 13 described above, although the side surfaces of the probes 12 and the side surfaces of the probe holes 16 are not in contact with each other in principle, contact portions 20 may be formed in the probe holes 16 by partially projecting at least one of the thin metal plates 14 such that the contact portions 20 are in contact with the probes 12 inserted into the probe holes 16 (see FIGS. 5A and 5B). Thus, the heat of the probes 12 can be reliably transferred through the contact portions 20 to the main body 15 to be cooled.

For example, as shown in FIG. 5A, the contact portions 20 are formed by shifting positions of the openings 18 of at least one (one first thin plate 14a in FIG. 5A) of the first and second thin plates 14a and 14b forming the main body 15 from positions corresponding to the openings 18 of the other first and second thin plates 14a and 14b. Alternatively, as shown in FIG. 5B, the contact portions 20 are formed by allowing the openings 18 of at least one (one first thin plate 14a in FIG. 5B) of the first and second thin plates 14a and 14b forming the main body 15 to have a diameter smaller than that of the openings 18 of the other first and second thin plates 14a and 14b. Thus, the contact portions 20 can be easily formed.

Further, with the pressure of the contact portions 20, the probes 12 are pressed against and in contact with the side surfaces of the probe holes 16 (FIG. 5A), or the circumference of the side surface of each of the probes 12 is in contact with the first thin plates 14a (or the second thin plates 14b). Accordingly, the positions of the probes 12 with respect to the probe holes 16, eventually, with respect to the housing 13 can be easily determined, and the probes 12 can be prevented from moving relative to the housing 13.

Further, the contact portions 20 and/or the side surfaces of the probes 12 in contact with the contact portions 20 are covered with an insulating film, so that the first thin plates 14a, the second thin plates 14b and the probes 12 are not electrically conducted to each other.

Next, a support body for contact terminals in accordance with a second embodiment of the present invention will be described.

Figure 6:
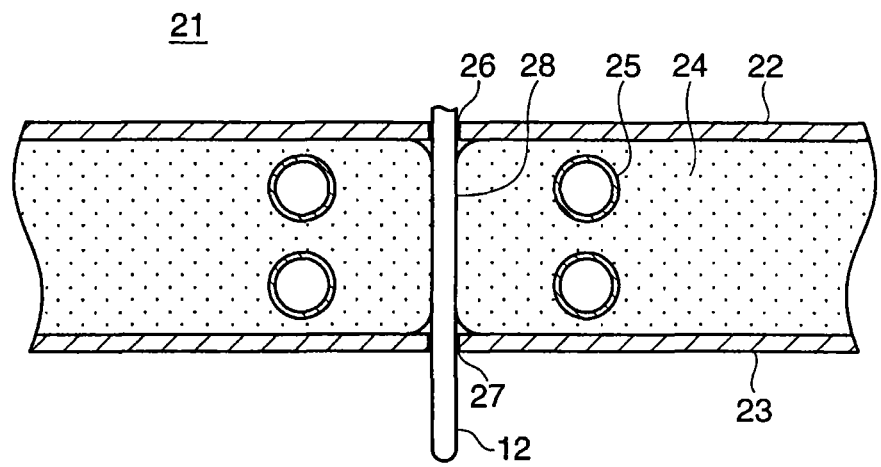
FIG. 6 is an enlarged partial cross-sectional view schematically showing a configuration of a housing serving as a support body for contact terminals in accordance with a second embodiment of the present invention.
Figure 7:
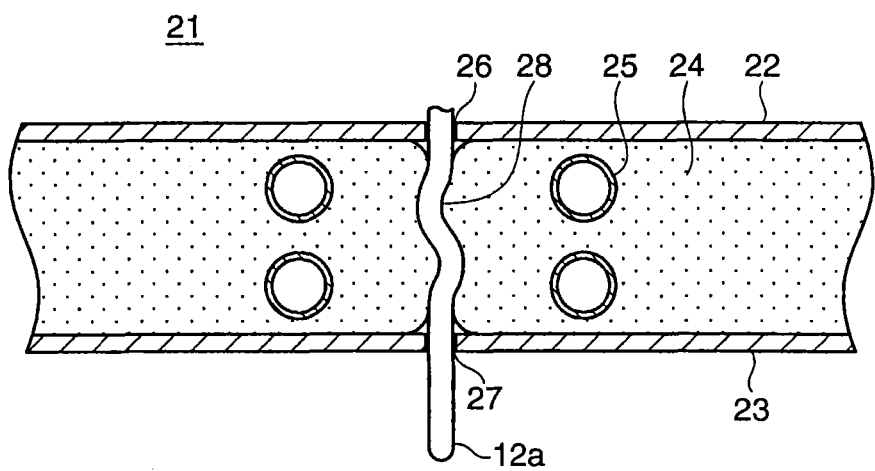
FIG. 7 is an enlarged partial cross-sectional view showing a configuration of a first modification of the housing shown in FIG. 6.

FIG. 6 is an enlarged partial cross-sectional view schematically showing a configuration of a housing serving as the support body for the contact terminals in accordance with the second embodiment of the present invention. The housing of FIG. 6 may also be applied to the probe card 10 of FIGS. 1A and 1B.

In FIG. 6, a housing 21 includes a pair of plate-shaped members facing each other, e.g., a pair of thin plates 22 and 23, a thermal conductor 24 filled between the thin plates 22 and 23, and coolant paths 25 embedded in the thermal conductor 24.

The thin plates 22 and 23 respectively have a plurality of openings 26 and 27 formed through the thin plates 22 and 23 in the thickness direction. The thin plates 22 and 23 are disposed such that the openings 26 and the openings 27 are arranged to correspondingly align with each other in the thickness direction. Further, a plurality of cylindrical probe holes 28 are formed by partially removing the thermal conductor 24 existing between the openings 26 and the openings 27.

In the housing 21, a diameter of the probe holes 28 is set to be substantially equal to a diameter of the probes 12. In particular, the diameter of the probe holes 28 formed in the thermal conductor 24 is set to be slightly smaller than the diameter of the probes 12, and for example, a difference between the two diameters is set to be in a range from 1 μm to 800 μm.

In this embodiment, as will be described later, the thermal conductor 24 is formed by a deformable material. Therefore, although the diameter of the probe holes 28 formed in the thermal conductor 24 is slightly smaller than the diameter of the probes 12, the probes 12 can be inserted into the probe holes 28, so that the probes 12 inserted into the probe holes 28 are in contact with the thermal conductor 24. The housing 21 is cooled by a gas or liquid coolant flowing in the coolant paths 25. The coolant paths 25 are disposed in the vicinity of the probe holes 28.

Joule heat generated in the probes 12 when a large amount of current flows therethrough is transferred to the thermal conductor 24, and then absorbed to the housing 21 which is cooled by the coolant flowing through the coolant paths 25. That is, since the housing 21 cools each of the probes 12, it becomes possible to prevent the temperature of the probes 12 from being increased too high, thereby preventing degradation of the probes 12.

As the material of the thermal conductor 24, a gel-like heat transfer material is preferable in view of deformability and outflow prevention, but it is not particularly limited thereto, and a less elastic material is preferable regardless of whether it is uncured or cured. Specifically, the material of the thermal conductor 24 has a viscosity ranging from 1 to 500 Pa·s, a thermal conductivity ranging from 0.1 to 10 W/m·K, and a hardness ranging from 1 to 70° (JIS K 6249). For example, oil compound (manufactured by Shin-Etsu Chemical Co., Ltd.), condensation-cure RTV rubber (manufactured by Shin-Etsu Chemical Co., Ltd.), curable silicone rubber (millable or liquid) or uncured silicone rubber (paste-like or gel-like), more specifically, addition-cure liquid silicone rubber (manufactured by Shin-Etsu Chemical Co., Ltd.) or paste-like heat conduction gel (λGEL (registered trademark)) (manufactured by Taika Co., Ltd.) is used as the material of the thermal conductor 24.

As described above, in this embodiment, the probes may have a curved shape rather than a linear shape because elasticity is given to the probes to improve the contact with electrode pads. Since the thermal conductor 24 is formed of a deformable material, probes 12a having a curve shape may be inserted into the probe holes 28 (see FIG. 7). In this case, the contact area between the probes 12a and the thermal conductor 24 increases, and thus it becomes possible to efficiently cool down each of the probes 12a.

Figure 8:
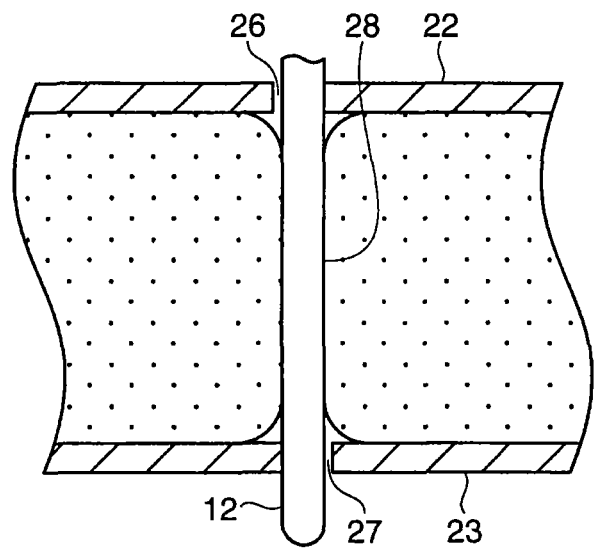
FIG. 8 is an enlarged partial cross-sectional view showing a configuration of a second modification of the housing shown in FIG. 6.

Further, in the housing 21, by shifting positions of the openings 26 of the thin plate 22 from positions corresponding to the openings 27 of the thin plate 23, the probes 12 inserted into the probe holes 28 may be actively brought into contact with the thin plate 22 and/or the thin plate 23 (see FIG. 8). Thus, Joule heat generated in the probes 12 can be transmitted to the thin plate 22 or the thin plate 23, thereby further improving the cooling efficiency of each of the probes 12. In addition, the positions of the probes 12 with respect to the probe holes 28, eventually, with respect to the housing 21 can be easily determined, and the probes 12 can be prevented from moving relative to the housing 21.

Although the present invention has been described using the above embodiments, the present invention is not limited to the above embodiments.

Figure 9:
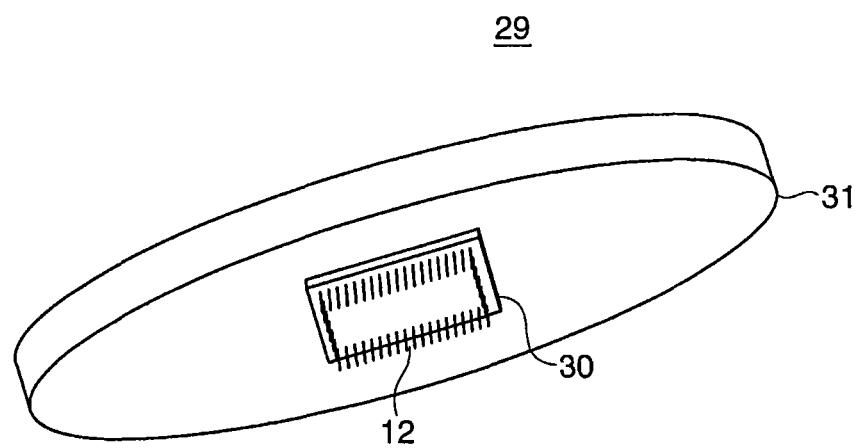
FIG. 9 is a perspective view schematically showing a configuration of a modification of the probe card to which the present invention is applied.

For example, although the probe card 10 is provided with the probes 12, the number of which corresponds to the number of electrode pads of the semiconductor devices in the semiconductor wafer in the above embodiments, a probe card 29 may have only the probes 12, the number of which corresponds to the number of electrode pads of one semiconductor device in the semiconductor wafer as shown in FIG. 9. Also in this case, each of the probes 12 is supported in a housing 30 to which the present invention is applied, and the housing 30 is attached to a base 31 of the probe card 29.

Further, it is preferable to configure such that the size of the housing 13 (or housing 21) in the above embodiments is set to be equal to the size of a housing in the conventional probe card (hereinafter, referred to as "conventional housing") and the conventional housing can be replaced with the housing 13 (or housing 21) in the above embodiments. Thus, even in the conventional probe card, it is possible to prevent degradation of the probes by simply replacing the housing.

In addition, in a case where the conventional housing is constituted by thin plates and its interior is formed of a housing body having a cavity, the probe holes 28 may be formed by filling the interior with the thermal conductor 24 and performing additional processing such as etching or machining on the thermal conductor 24 filled therein. Alternatively, the probe holes 28 may be formed by filling the thermal conductor 24 therein after inserting a jig through each of the openings 26 and 27 and extracting each jig. Thus, the housing 21 in the above embodiment can be formed by performing additional processing on the conventional housing.

While the invention has been shown and described with respect to the embodiments, it will be understood by those skilled in the art that various changes and modification may be made without departing from the scope of the invention as defined in the following claims.

What is claimed is:

1. A support body for a plurality of contact terminals included in a probe card for inspecting semiconductor devices formed in a semiconductor substrate, the support body comprising:
    a pair of plate-shaped members facing each other;
    a thermal conductor filled between the pair of plate-shaped members; and
    a plurality of contact terminal holes, each of which is formed by arranging openings, which are formed through the plate-shaped members in a thickness direction of the plate-shaped members, to substantially align with one another in the thickness direction,
    wherein the contact terminals are inserted into the contact terminal holes to be in contact with the thermal conductor, and
    wherein one or more coolant paths are embedded in the thermal conductor.

2. The support body of claim 1, wherein a side surface of a contact terminal inserted into each of the contact terminal holes is brought into contact with a side surface of an opening of each of at least one of the pair of plate-shaped members by shifting a position of an opening of one of the pair of plate-shaped members from a position of an opening of the other one of the pair of plate-shaped members.

3. A probe card for inspecting semiconductor devices formed in a semiconductor substrate, the probe card comprising:
    a support body for a plurality of contact terminals included in the probe card for inspecting semiconductor devices formed in a semiconductor substrate, the support body comprising:
    a pair of plate-shaped members facing each other;
    a thermal conductor filled between the pair of plate-shaped members; and
    a plurality of contact terminal holes, each of which is formed by arranging openings, which are formed through the plate-shaped members in a thickness direction of the plate-shaped members, to substantially align with one another in the thickness direction,
    wherein the contact terminals are inserted into the contact terminal holes to be in contact with the thermal conductor, and
    wherein one or more coolant paths are embedded in the thermal conductor.

* * * * *